United States Patent
Chen

(10) Patent No.: US 7,551,500 B2
(45) Date of Patent: Jun. 23, 2009

(54) MEMORY CELL FUSE CIRCUIT AND CONTROLLING METHOD THEREOF

(75) Inventor: Yung-Hsu Chen, Hsin-Chu (TW)

(73) Assignee: Macronix International Co., Ltd, Hsin-Chu (TW)

( * ) Notice: Subject to any disclaimer, the term of this patent is extended or adjusted under 35 U.S.C. 154(b) by 4 days.

(21) Appl. No.: 11/860,656

(22) Filed: Sep. 25, 2007

(65) Prior Publication Data

US 2009/0080277 A1 Mar. 26, 2009

(51) Int. Cl.
*G11C 7/02* (2006.01)
*G11C 17/00* (2006.01)
*G11C 17/18* (2006.01)

(52) U.S. Cl. .................. 365/210.15; 365/96; 365/225.7

(58) Field of Classification Search ............ 365/210.15, 365/225.7
See application file for complete search history.

(56) References Cited

U.S. PATENT DOCUMENTS 6,404,680 B1* 6/2002 Kwon ...................... 365/185.3
6,670,843 B1* 12/2003 Moench et al. ............. 327/525
6,839,280 B1* 1/2005 Chindalore et al. .... 365/185.18
2005/0216652 A1* 9/2005 Chen ......................... 711/103
2005/0237842 A1* 10/2005 Takeuchi et al. ......... 365/225.7

* cited by examiner

*Primary Examiner*—Son L Mai
(74) *Attorney, Agent, or Firm*—Volpe and Koenig, P.C.

(57) ABSTRACT

A controlling method of a memory cell fuse circuit is provided. The memory cell fuse circuit at least includes a reference cell fuse circuit and a plurality of normal cell fuse circuit. The reference cell fuse circuit includes a reference fuse cell and each the normal cell fuse circuit includes a normal fuse cell. The controlling method includes steps of: power on read and sensing digits of the memory cell fuse circuit; detecting if any normal fuse cell is non blank as failed; programming the reference fuse cell if at least one normal fuse cell is failed until all normal fuse cells are blank; programming and reading the normal fuse cell of each the normal cell fuse circuit; and outputting data of each the normal fuse cell.

8 Claims, 5 Drawing Sheets

MEMORY CELL FUSE CIRCUIT AND CONTROLLING METHOD THEREOF

FIELD OF THE INVENTION

The present invention relates to a fuse cell circuit of memory and controlling method thereof. The fuse cells are used to store initial parameters of memory, such as parameters of power supply or address of repair blocks. The fuse cells can be any types of nonvolatile memory cells, such as floating gate memory cells, trapping memory cells, phase change memory cells and so on.

BACKGROUND OF THE INVENTION

Please refer to FIG. 1, which is a circuit diagram showing a conventional memory cell fuse circuit according to the prior art. In FIG. 1, the memory cell fuse circuit 1 includes a PMOS transistor M1, a capacitor CL, a NMOS transistor M2, a fuse latch 10, a NOR gate NR1, a NMOS transistor M3, and a fuse cell M4. The fuse latch 10 includes two inverters IV1 and IV2 connected reversely in parallel to each other.

In the memory cell fuse circuit 1, the PMOS transistor M1 has a source electrically connected to a voltage source VDD, a gate electrically connected to reset signal FRESETB, a drain electrically connected to one end of the capacitor CL and the input of the inverter IV1. The NMOS transistor M2 has a drain electrically connected to the fuse cell M4, a gate electrically connected to a bias signal BIAS, and a source electrically connected to the output of the inverter IV2. The NOR gate NR1 has a first input electrically connected to a control signal FPGMB, a second input electrically connected to the output of the inverter IV1 and the input of the inverter IV2, an output electrically connected to the gate of the NMOS transistor M3. The drain of the NMOS transistor M3 is electrically connected to the fuse cell M4. The control terminal of the fuse cell M4 is electrically connected to a word line signal FWL.

FIG. 2 is a diagram showing the signals in the memory cell fuse circuit of FIG. 1. With reference to FIGS. 1 & 2, the operation principles of the memory cell fuse circuit 1 are described as follows. When the voltage source VDD is high, an external signal POR (not shown in FIG. 1) is high. The reset signal FRESETB is low and the PMOS transistor M1 is turned on. The capacitor CL is precharged so that the node FD reaches a high level VDD. The bias signal BIAS rises and the word line signal FWL rises. One terminal of the fuse cell M4 is connected to ground GND. The memory cell fuse circuit 1 is in the reading mode to read the values of the cell M4.

Based on the digits of the memory, the memory has the corresponding number of the memory cell fuse circuits 1. By the above operations toward all of the memory cell fuse circuits, the whole configuration memory can be read completely, so as to confirm the initial condition of the memory.

In the memory cell fuse circuit, there exists one reference cell fuse circuit and the others are normal cell fuse circuits. Generally, the cell current of the normal cell fuse circuit is more than that of the reference cell fuse circuit, and the fuse latch of the reference cell fuse circuit is stronger than that of the normal cell fuse circuit. Therefore, it is certain that the reference cell fuse circuit swaps slower than the normal cell fuse circuit.

However, for the factors of the manufacturing process, the transistor of the fuse cell will have a threshold voltage ($V_T$) distribution as shown in FIG. 3. If the $V_T$ value of the fuse cell transistor in the reference cell fuse circuit is smaller, i.e. at the left of the distribution curve of FIG. 3, the normal cell fuse circuit with a larger $V_T$ value, i.e. at the right of the distribution curve of FIG. 3, will be regarded as fail when the word line signal FWL turns off the normal cell fuse circuit.

SUMMARY OF THE INVENTION

It is therefore an object of the present invention to provide a controlling method of a memory cell fuse circuit at least including a reference cell fuse circuit and a plurality of normal cell fuse circuit, the reference cell fuse circuit including a reference fuse cell, each the normal cell fuse circuit including a normal fuse cell, including steps of: sensing digits of the memory cell fuse circuit in power on; detecting if any normal fuse cell is failed as non blank data; programming the reference fuse cell if at least one normal fuse cell is failed until all normal fuse cells are blank; programming and reading the normal fuse cell of each the normal cell fuse circuit; and outputting data of each the normal fuse cell.

According to the foregoing object of the present invention, a memory cell fuse circuit is provided. The memory cell fuse circuit includes
 a plurality of normal cell fuse circuit respectively including:
  a first fuse latch for sensing digits of the memory cell fuse circuit; and
  a normal fuse cell; and
 a reference cell fuse circuit including:
  a second fuse latch for detecting if turn off FWL bias to stop power on read sequence; and
  a reference fuse cell for being programmed if at least one normal fuse cell is not blank as failed so as to make the first fuse latch output blank data.

According to the foregoing object of the present invention, a memory cell fuse circuit is provided. The memory cell fuse circuit includes:
 at least two cell fuse circuits, wherein a reference cell fuse circuit includes:
  a fuse latch for detecting if turn off FWL bias to stop power on read sequence; and
  a reference cell fuse for being programmed if any other fuse cell is not blank as failed so as to make the fuse latch output blank.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

The circuit structure of the memory cell fuse circuit provided in the present invention is the same with that of the conventional one provided in the prior art. Therefore, the detailed description will be omitted here.

Figure 4:
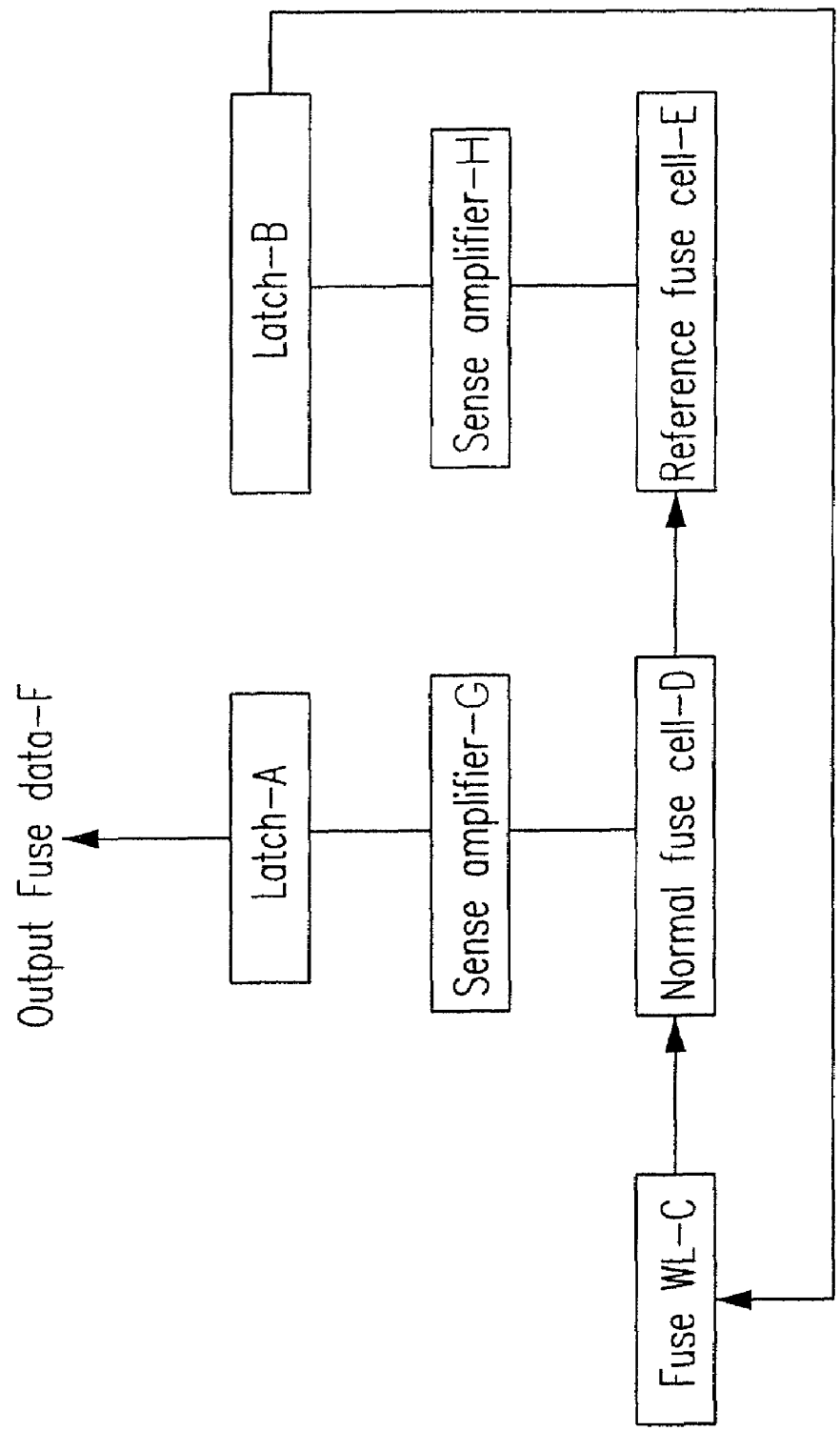
FIG. 4 is a block diagram showing the memory cell fuse circuit according to the present invention.

Please refer to FIG. 4, which is a block diagram showing the memory cell fuse circuit according to the present invention. Although the memory cell fuse circuit provided in the present invention includes a plurality of normal cell fuse circuits and a reference cell fuse circuit, the memory cell fuse circuit provided in the embodiment shown in FIG. 4 includes a normal cell fuse circuits and a reference cell fuse circuit.

Figure 1:
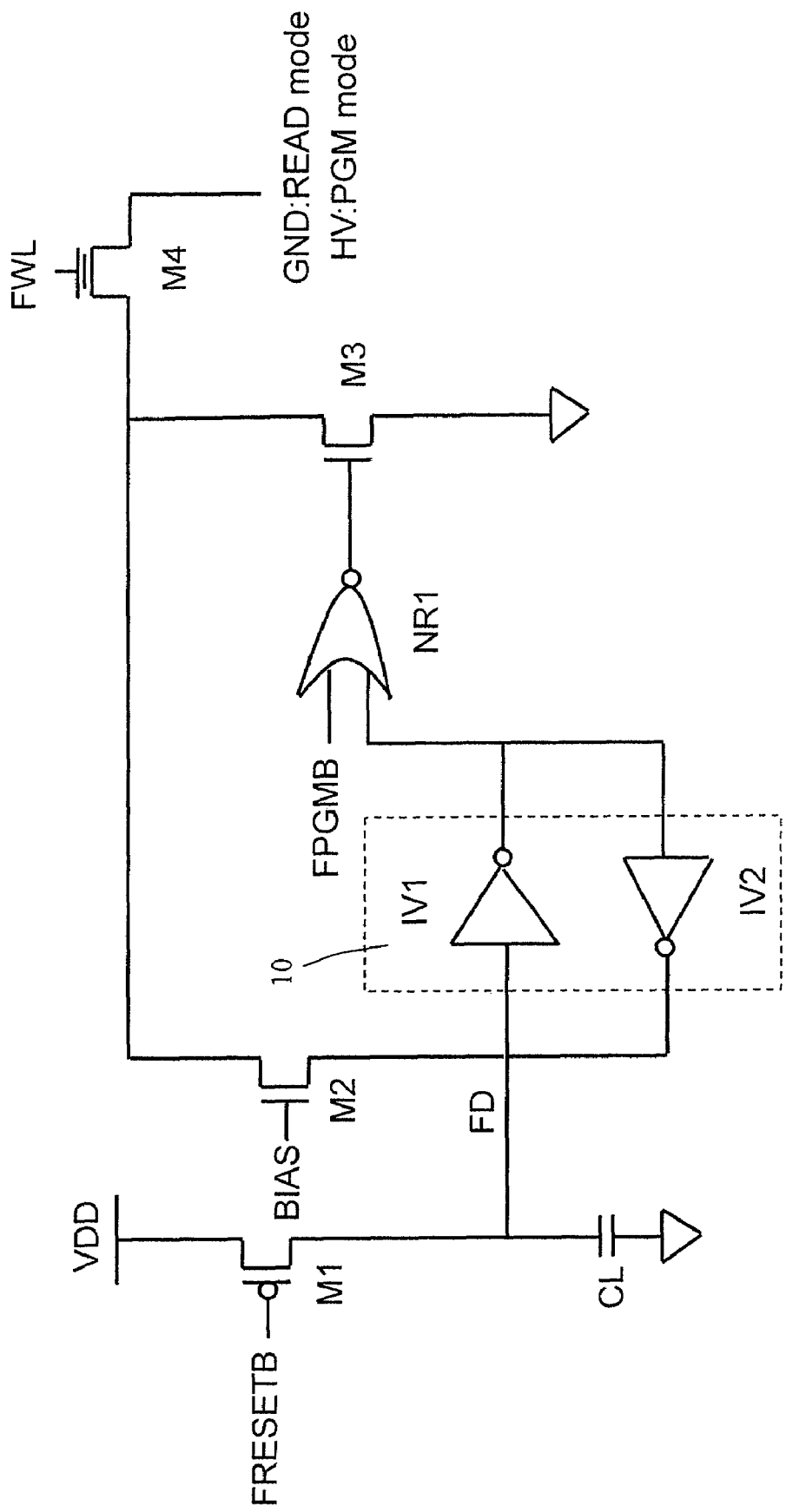
FIG. 1 is a circuit diagram showing a conventional memory cell fuse circuit according to the prior art.
Figure 2:
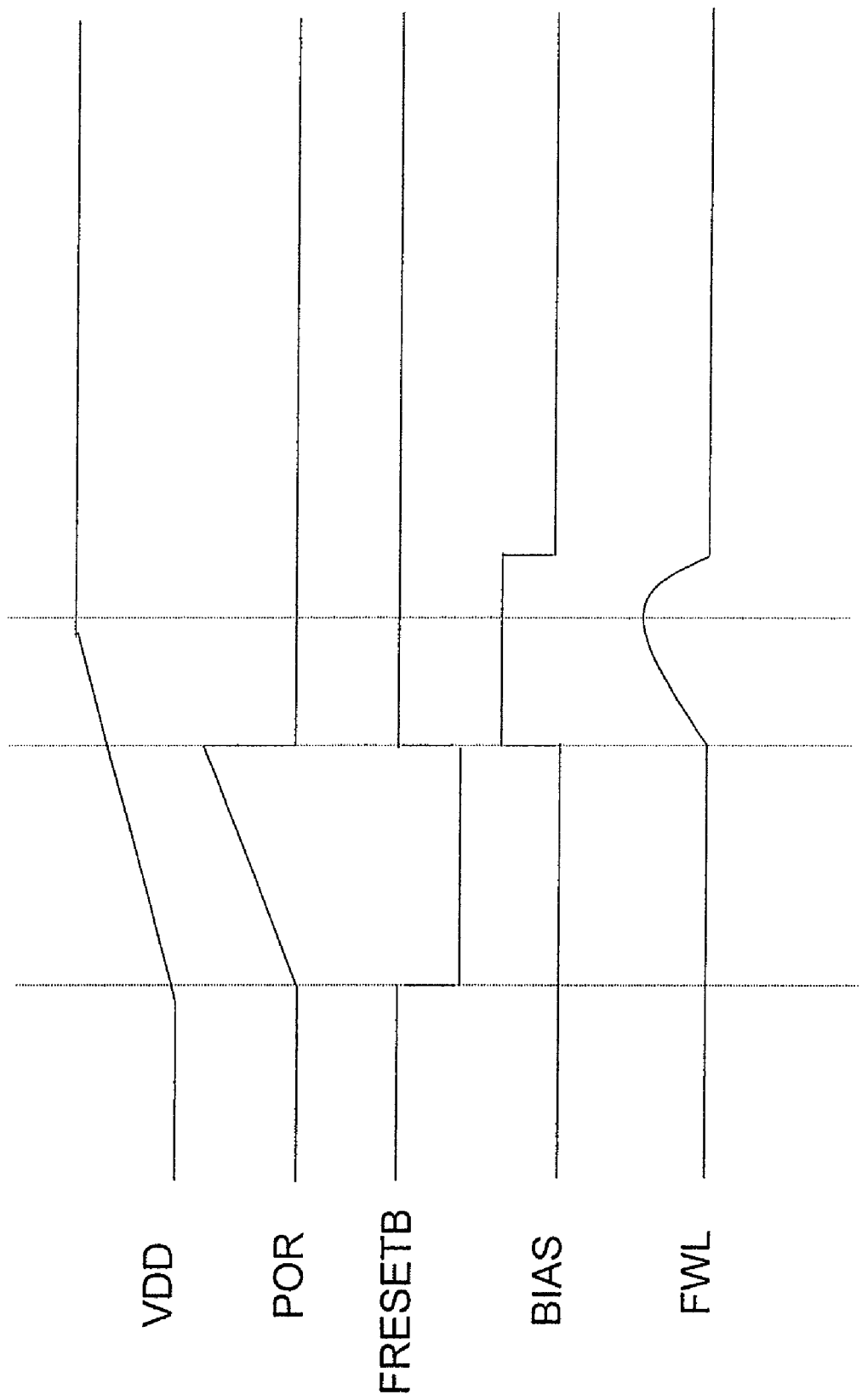
FIG. 2 is a diagram showing the signals in the memory cell fuse circuit of FIG. 1.
Figure 3:
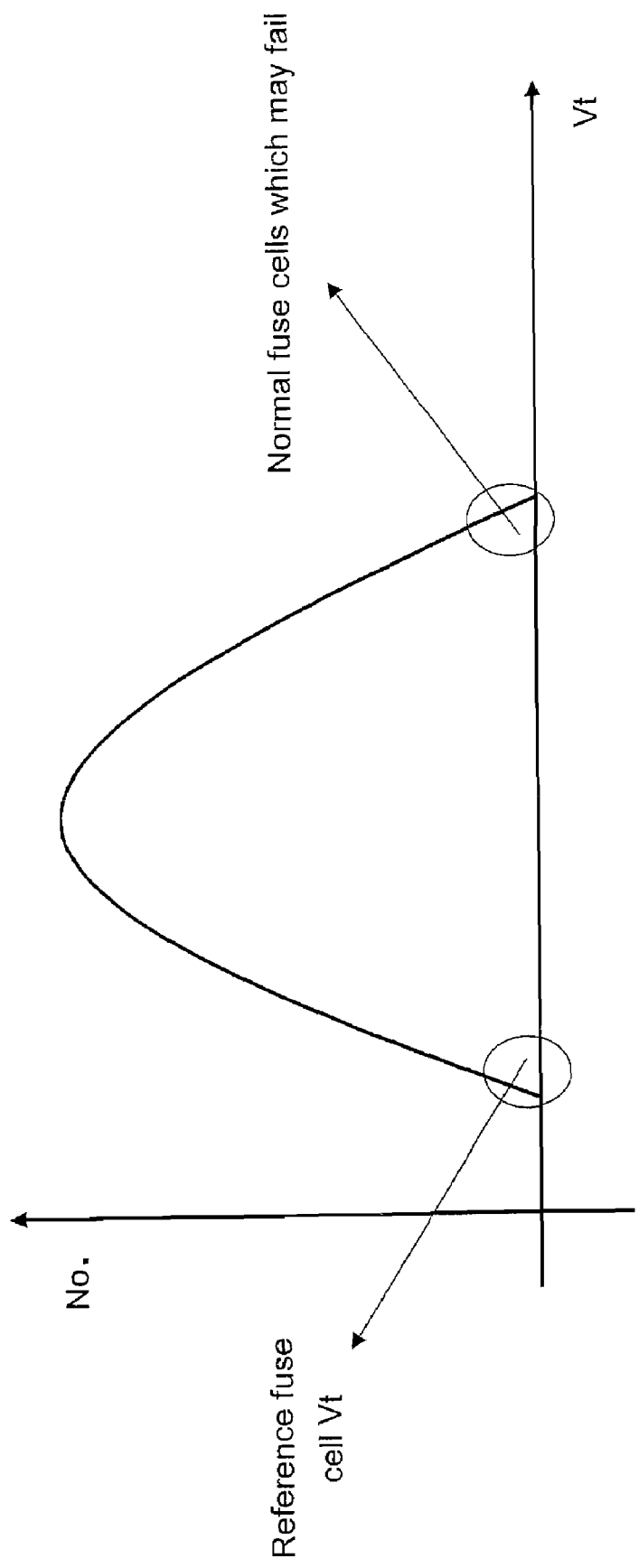
FIG. 3 is a curve diagram showing the transistor threshold voltage distribution of the fuse cell.

In FIG. 4, the normal cell fuse circuit includes a first fuse latch A and a normal fuse cell D, the reference cell fuse circuit includes a second fuse latch B and a reference fuse cell E, and the control terminal of the reference fuse cell E is further electrically connected to a word line WL-C for providing the word line signal FWL shown in FIG. 1.

The operation principles of the memory cell fuse circuit shown in FIG. 4 are described as follows. The first fuse latch A senses the digits of the memory cell fuse circuit if any not blank data as fail, and the second fuse latch B detects if turn off FWL bias to stop power on read sequence. If there exists at least one normal fuse cell D is failed, the word line WL-C biases and programs lightly the reference fuse cell E of the reference cell fuse circuit to avoid over program, which hence enters a PGM mode as shown in FIG. 1. Then the normal fuse cell D of each the normal cell fuse circuit will be read. After the normal fuse cells D are read as all blank, the normal fuse cells D can be programmed, and output the data F stored in each normal fuse cell D.

In addition to the reference fuse cell E of the reference cell fuse circuit is biased and programmed by the word line WL-C, a control signal FPGMB shown in FIG. 1 is still needed here for controlling the program time and slowing down the program condition of the reference fuse cell E.

A memory circuit having a memory array which has a plurality of word lines. The memory circuit comprises a plurality of normal cells Ds coupled to a plurality of sense amplifiers, e.g. G and H, and a plurality of reference cells Es coupled to the sense amplifiers, e.g. G and H, wherein at least one of the reference cells Es is programmed if at least one of the normal cells Ds is not blank until all the normal cells are read as blank. An output terminal of each the sense amplifiers, e.g. G and H is coupled to a latch, e.g. A and B. Each word line is controlled by a value stored in the latch, e.g. B.

Figure 5:
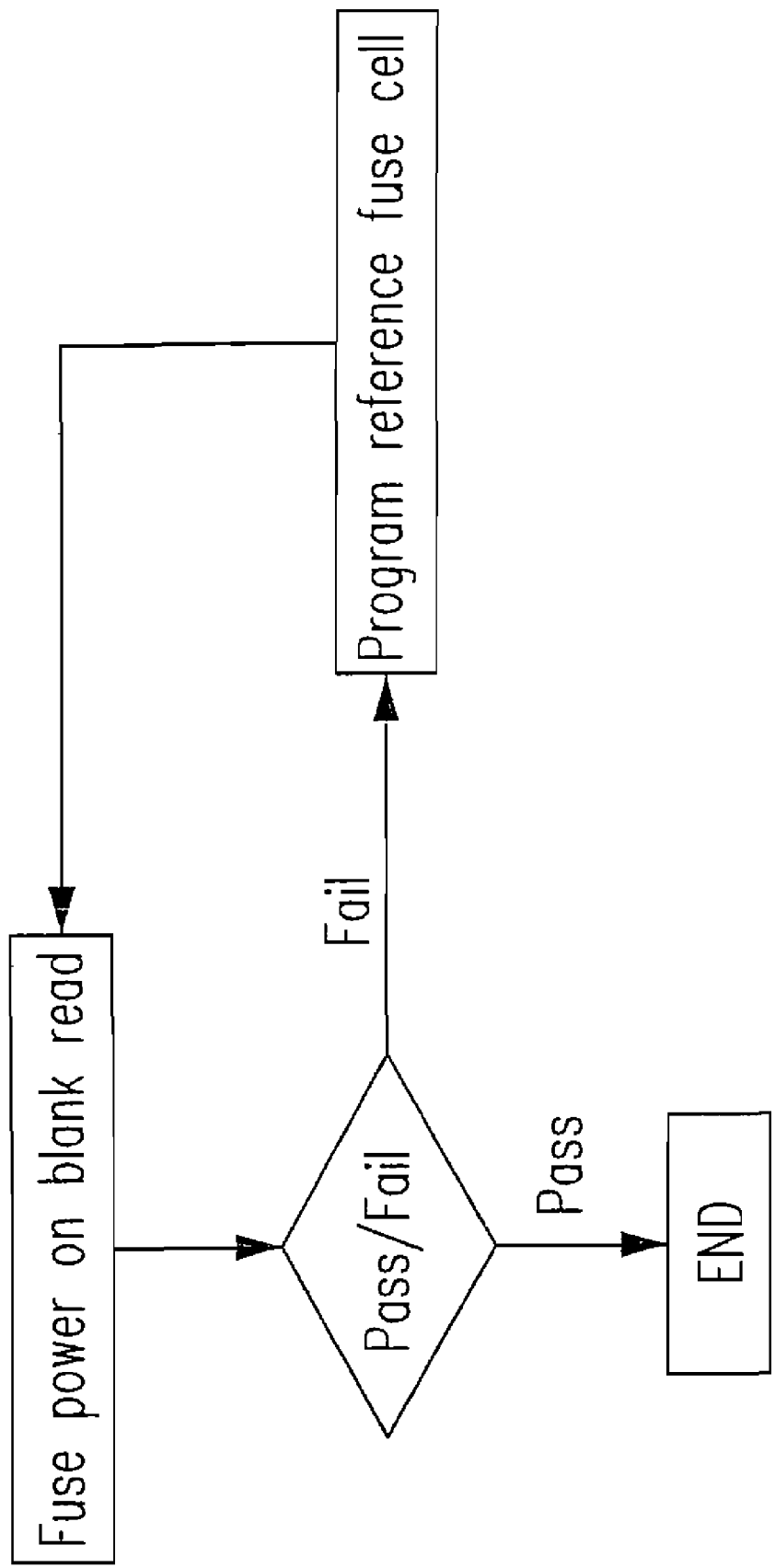
FIG. 5 is a flow chart showing the controlling method of the memory circuit of FIG. 4.

Please refer to FIG. 5, which is a flow chart showing the controlling method of the memory circuit of FIG. 4. The steps of the above controlling method comprises:
(a) reading the normal cells in a power on procedure;
(b) detecting if any normal cell is not blank; and
(c) programming the reference cell if at least one of the normal cells is not blank until the reading of all the normal cells are blank.

In conclusion, with the memory cell fuse circuit and the controlling method thereof provided in the present invention, the initial fail can be prevented while the memory is powered on, the reading margin of the fuse circuit can be increased, and the cost can still be remained for no increase of the original circuit.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of controlling a memory in an integrated circuit including a plurality of normal cells and a reference cell, comprising steps of:
   (a) reading the normal cells in a power on procedure;
   (b) detecting if any normal cell is not blank; and
   (c) programming the reference cell if at least one of the normal cells is not blank until the reading of all the normal cells are blank.

2. The controlling method as claimed in claim 1, wherein the integrated circuit further comprises a first latch for executing steps (a) and (c).

3. The controlling method as claimed in claim 1, wherein the integrated circuit further comprises a second latch for executing step (b).

4. The controlling method as claimed in claim 1, wherein the integrated circuit further comprises a word line for executing step (c).

5. The controlling method as claimed in claim 4, wherein the word line executes step (c) by biasing the reference cell.

6. A memory circuit having a memory array which has a plurality of word lines, comprising:
   a plurality of normal cells coupled to a plurality of sense amplifiers; and
   a plurality of reference cells coupled to the sense amplifiers, wherein at least one of the reference cells is programmed if at least one of the normal cells is not blank until all the normal cells are read as blank.

7. The memory circuit of claim 6, wherein an output terminal of each the sense amplifiers is coupled to a latch.

8. The memory circuit of claim 7, wherein each the word lines is controlled by a value stored in the latch.

* * * * *